United States Patent [19]
Dupont et al.

[11] Patent Number: 5,539,760
[45] Date of Patent: Jul. 23, 1996

[54] PROCESS FOR THE TRANSPOSITION OF AN OPTICAL MODULATION OF ONE WAVELENGTH TO ANOTHER ADJUSTABLE WAVELENGTH

[75] Inventors: Hervé Dupont, Lannion; René Auffret; André Tromeur, both of Louannec, all of France

[73] Assignee: France Telecom Etablissement autonome de droit public, Paris, France

[21] Appl. No.: 299,663

[22] Filed: Sep. 2, 1994

[30] Foreign Application Priority Data

Sep. 9, 1993 [FR] France ................................ 93 10737

[51] Int. Cl.$^6$ ........................................................ H01S 3/10
[52] U.S. Cl. ................................... 372/28; 372/38; 372/32; 372/23
[58] Field of Search ................................... 378/28, 32, 23, 378/38

[56] References Cited

U.S. PATENT DOCUMENTS 5,020,062   5/1991   Cusack, Jr. et al. ........................ 372/28

5,432,629   7/1995   Shikada et al. ........................... 372/28

OTHER PUBLICATIONS

Journal of Optical Communications, vol. 12, No. 2, 1991, pp. 64–68, Ph. Doare, "Optical Phase Modulation Behavior of an Injection–Locked Semiconductor Laser for an Optical Transmission System" 1991–Only Date Available.

Primary Examiner—Leon Scott, Jr.
Attorney, Agent, or Firm—Oblon, Spivak, McClelland, Maier & Neustadt

[57] ABSTRACT

A process for the transposition of a modulation of an adjustable wavelength. A semiconductor amplifier is relooped through a feedback loop including a filter set to a first wavelength. An incident beam set at a second wavelength which is amplitude modulated is injected into the semiconductor amplifier laser. The incident beam is either extinguished or allows self-oscillation to be established in the loop. Thus, the modulation is transposed from the second wavelength to the first wavelength.

3 Claims, 3 Drawing Sheets

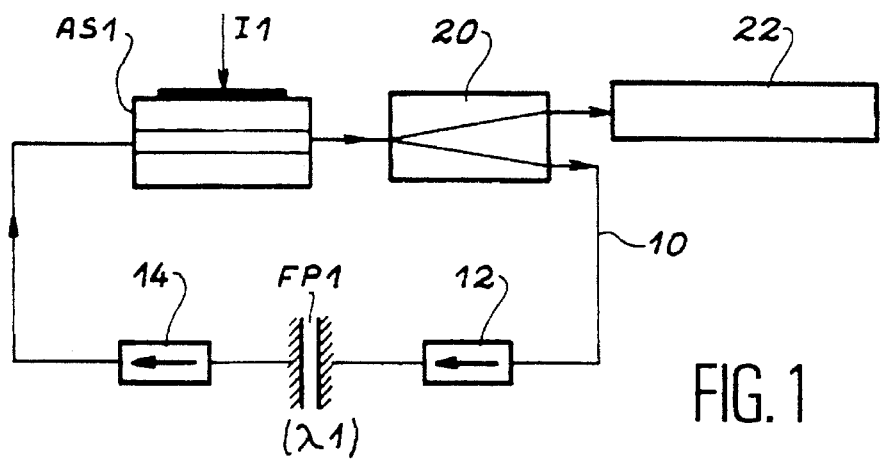
FIG. 1
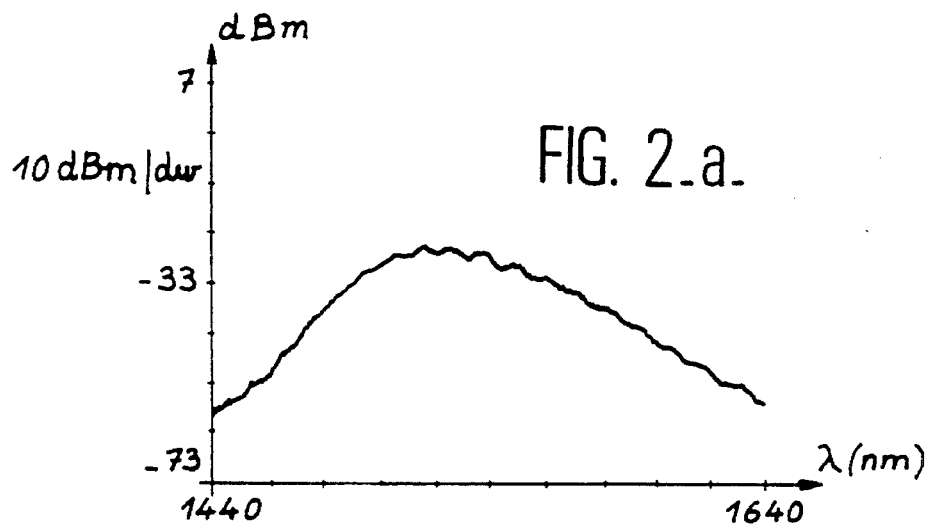
FIG. 2_a_
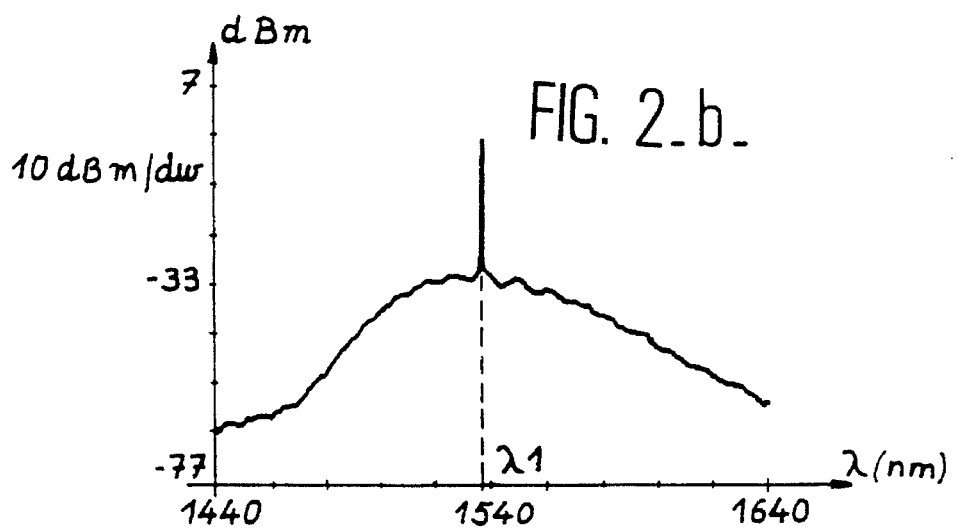
FIG. 2_b_

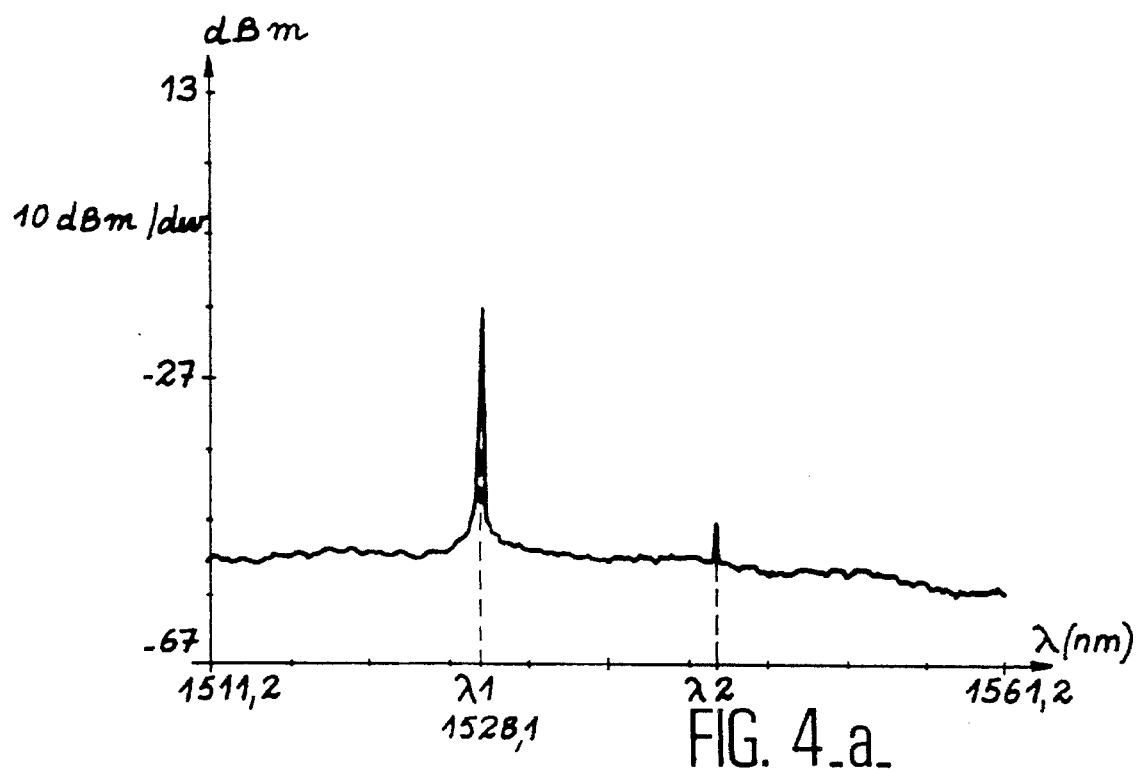
FIG. 4_a_
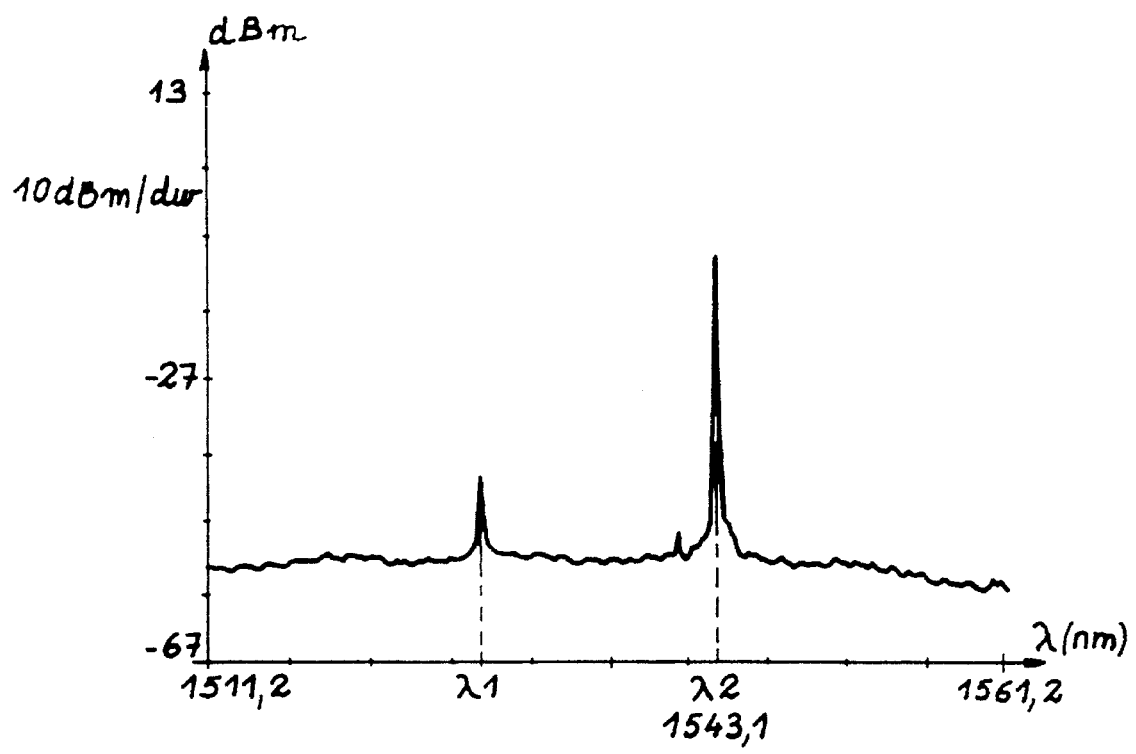
FIG. 4_b_

PROCESS FOR THE TRANSPOSITION OF AN OPTICAL MODULATION OF ONE WAVELENGTH TO ANOTHER ADJUSTABLE WAVELENGTH

BACKGROUND OF THE INVENTION

1. Field of the Invention

The present invention relates to a process for the transposition of an optical modulation having one wavelength to another adjustable wavelength. It is used in optical telecommunications.

2. Discussion of the Background

The introduction of optics into telecommunications networks has been due to the great transmission capacity offered by optical links. In order to take full advantage of this and obtain an optical transparency over the entire network, it is necessary to limit to the maximum the use of optical/electrical and electrical/optical connections. This is the reason why optical amplifiers (with doped fibres or semiconductors) have been developed. By ensuring an all-optical regeneration of the signals, they make it possible to eliminate electrical repeaters.

In a telecommunications network using several wavelengths (so-called multicolour network), the routing operation (known as space-division switching of circuits or wavelength switching) involves basic functions fulfilled by wavelength-tunable transmitters, large capacity star couplers or tunable optical filters. To these functions must be added that of wavelength transposition consisting of transferring the information from one optical carrier to another. It permits not only the switching of an information in a network by "colouring" the signal, but also the connection between two local multicolour networks.

In order to obtain this transposition, one possibility consists of detecting the information received on one wavelength and using the resulting electrical signal for modulating a laser emitting at another wavelength.

A device able to fulfil this function can be in two different forms:

in the first, the information is initially on a fixed wavelength $\lambda_o$ and is transposed to another wavelength $\lambda_i$ chosen from among n possible wavelengths, so that it is successively possible to access, at the output of the device, the information on any of the wavelengths $\lambda_1, \lambda_2, \ldots, \lambda_n$;

in the second, the information reaches the device on a wavelength $\lambda_i$ selected from among n possible wavelengths and the device transfers the signal to another fixed wavelength $\lambda_o$.

Hitherto, this transposition operation has been obtained with the aid of laser diodes and semiconductor amplifiers. In the first case, action occurs on the transmission or emission wavelength of a monomode laser of the distributed feedback or DFB type or distributed Bragg reflection or DBR type, by optical injection in the active zone.

This is described in the two following articles:

P. POTTIER, M. J. CHAWKI, R. AUFFRET, G. CLAVEAU, A. TROMEUR, "1.5 Gbit/s transmission system using all optical wavelength convertor based on tunable two-electrode DFB laser", Electron. Lett., vol. 27, pp 2183–2184, 1991;

B. MIKKELSEN, T. DURHUUS, R. J. PEDERSEN, K. E. STUBKJAER, "Penalty free wavelength conversion of 2.5 Gbit/s signals using a tunable DBR-laser", Proc. ECOC'92, Berlin, September 1992.

With regards to semiconductor amplifiers, they make use either of the gain saturation variation phenomenon, or mixing with four waves, in order to bring about the transposition.

This is described in the two following articles:

J. M. WIESENFELD, B. GLANCE, "Cascadability and fanout of semiconductor optical amplifier wavelength shifter" IEEE Photon. Technol. Lett., vol. 4, pp 1168–1171, 1992;

G. GROSSKOPF, R. LUDWIG, H. G. WEBER, "140 Mbit/s DPSK transmission using an all-optical frequency convertor with a 4000 GHz conversion range" Electron Lett., vol. 24, pp 1106–1107, 1988.

Despite their interesting performance characteristics, these different processes have a high level of complexity, namely either the process is difficult to perform (particularly with regards to the adjustments of the wavelengths of the incident and transpose signal) or require the use of a pumping laser.

SUMMARY OF THE INVENTION

The object of the present invention is to avoid these disadvantages.

To this end, the invention proposes a process consisting of:

using a semiconductor amplifier laser, whose output is relooped on the input by a feedback loop provided with an optical filter tuned to a first wavelength $\lambda_1$, the said means being able to self-oscillate at said wavelength $\lambda_1$, injecting into the semiconductor amplifier laser an incident beam having a second wavelength $\lambda_2$, said incident beam being amplitude-modulated and passing alternately from a high level to a low level, regulating the modulation of this incident beam in such a way that for the high amplitude level of the incident beam, the self-oscillation condition of the amplifier laser relooped on the wavelength $\lambda_1$ will no longer be satisfied, the amplifier laser then performing a simple amplification of the signal at the second wavelength $\lambda_2$, whereas for the low amplitude level of the incident beam, the self-oscillation of the relooped amplifier laser is reestablished, the amplifier laser emitting on said first wavelength $\lambda_1$, the amplitude modulation of the incident laser at said second wavelength thus being transposed into a complimentary amplitude modulation at the first wavelength.

Compared with the known processes, this process offers numerous advantages. Firstly, it avoids the use of a pumping laser. The performance device only has a semiconductor amplifier and a filter, so that the amount of equipment is reduced. In addition, the selection of the wavelength towards which the transposition takes place is obtained by simply adjusting an optical filter to the feedback loop, leading to ease of use, such a filter making the wavelength choice easy and leads to a flexibility on the part of the device. Moreover, in view of the fact that use is made of a semiconductor amplifier, the incident wavelength $\lambda_1$ and the transposed wavelength $\lambda_2$ can be chosen over the entire amplifier gain curve, so that this type of transposition is made particularly attractive. Finally, if the residual reflectivity of the faces of the semiconductor amplifier partly persists (approximately $10^{-4}$), small resonances appear on the gain curve, so that it is possible to use these resonances for defining a wavelength range for which the laser effect and the transposition is obtained in a privileged manner.

BRIEF DESCRIPTION OF THE DRAWINGS

FIG. 1 is a basic diagram of a feedback loop semiconductor amplifier laser.

FIG. 2 shows the emission spectra of the semiconductor amplifier without feedback (a) and with feedback (b).

FIG. 4 shows the emission spectrum of the amplifier provided with its feedback loop without injected beam (a) and with injected beam (b).

DETAILED DESCRIPTION OF AN EMBODIMENT

Figure 3:
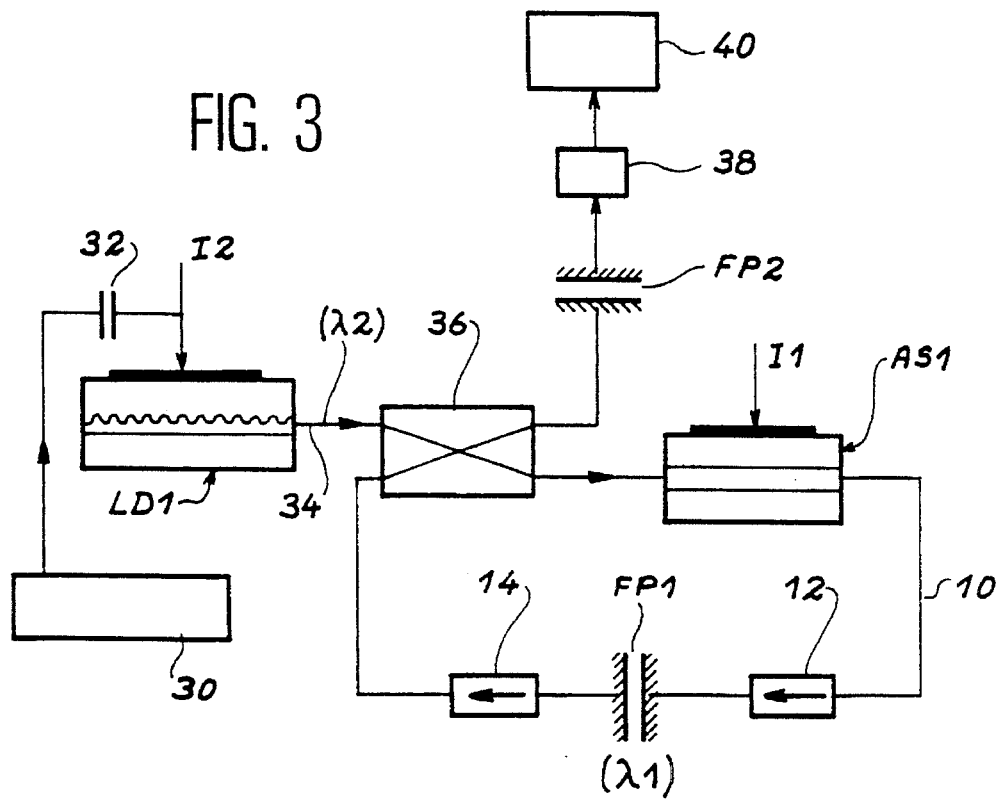
FIG. 3 is a diagram of an experimental circuit for implementing and testing the process according to the invention.

The device shown in FIG. 1 comprises an amplifier laser AS1, whose optical output is relooped on the input by a fibre optics loop 10. This loop comprises a first insulator 12, an optical filter which can be in the form of an air wedge FP1 and a second insulator 14. The insulators prevent any return into the semiconductor amplifier of light which is spectrally outside the pass band of the filter.

In order to study the operation of such a means, it is useful to insert an optical coupler 20 having an input and two outputs, one of the outputs being connected to the loop 10 and the other to an analyzer 22, which makes it possible to record spectra like those of FIG. 2.

In part (a) of FIG. 2 it is possible to see the spontaneous emission spectrum obtained without feedback, i.e. with open loop. In part (b) it is possible to see the spectrum with feedback and with its self-oscillation peak. The wavelength $\lambda_1$ of this peak is defined by the filter FP1 and in the illustrated example $\lambda 1$ is at 1540 nm.

FIG. 3 shows an experimental device making it possible to test the performance characteristics of the process according to the invention. It is possible to see the semiconductor amplifier AS1 supplied by a current I1 and its feedback loop 10, with its filter FP1 defining $\lambda_1$.

There is also a monoelectrode laser diode LD1 supplied by a current I2 and current-modulated by a generator 30 connected to the electrode across a capacitor 32. This laser diode emits a beam 34 at wavelength $\lambda_2$. Therefore this beam is amplitude-modulated at the clock cycle imposed by the generator 30 and it is therefore a question of transposing this optical signal.

The circuit also comprises a 2 to 2 coupler 36, a second FABRY-PEROT filter FP2, a photodetector 38, e.g. a PIN diode, and an oscilloscope 40.

As a non-limitative example, the experimental conditions under which the validity of the process according to the invention was checked are given below. The faces of the laser amplifier AS1 are treated with antireflection coatings in order to lower their reflectivity to approximately $10^{-5}$. The current I1 is 68.3 mA. The definition of the FABRY-PEROT filter FP1 can be 100 and its full width half maximum is 0.33 nm (43 GHz). The self-oscillation of the thus relooped amplifier was fixed at $\lambda 1=1528.1$ nm by the position of the optical filter FP1. The supply current I2 of the laser diode LD1 is modulated at around 34.1 mA and the corresponding wavelength $\lambda_2$ is 1543.1 nm.

The second FABRY-PEROT filter FP2 is used for selecting the desired wavelength $\lambda_1$ or $\lambda_2$ as a function of whether the source signal or the transposed signal is displayed. It has a definition of 100 and a full width half maximum of 0.1 nm (13 GHz).

FIG. 4 shows the results obtained. Part (a) shows the spectrum obtained without an incident beam. The line present at $\lambda_1=1528.1$ nm is the self-oscillation line of the amplifier AS1 looped on itself. Part (b) shows the spectrum with an incident beam of optical power 74 µW injected into the laser amplifier. It can be seen that the oscillation at $\lambda_1$ is virtually extinguished, the extinction being approximately 25 dB and that there is a dominant oscillation at 1543.1 nm, which is the wavelength $\lambda_2$ of the incident beam 34.

This transposition can be explained in the following way. As the incident beam injected into the semiconductor amplifier is amplitude-modulated, said amplitude (or the power of the injected beam) passes alternately through a low level and a high level. Thus, there is an alternate passage from a self-oscillating operation, like that of part (a), to an injection operation, where the self-oscillation is extinguished, as in part (b).

Figure 5:
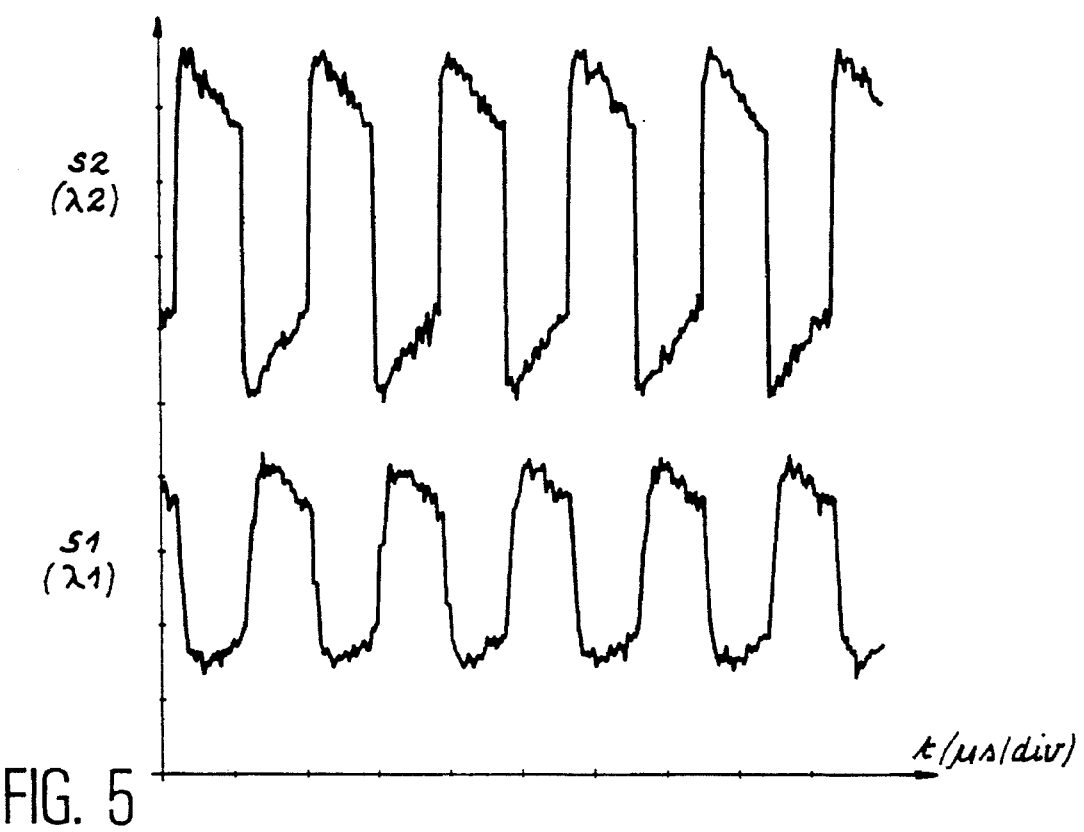
FIG. 5 shows the complimentary modulations of the incident beam and the transposed beam.

The transposition of the modulation can be better gathered from FIG. 5, which shows the configuration of the signals S1 and S2 corresponding to the two wavelengths $\lambda_1$ and $\lambda_2$. The top signal corresponds to the incident signal, whereas the bottom signal represents the transposed signal. On the wavelength $\lambda_1$ is recovered the modulation complimentary of that of the incident signal.

In the described study, the laser LD1 was modulated at 300 kHz, which may appear to be low. This limitation is due to the fact that the feedback loop extended over about 10 meters of optical fibre. In view of this length, the establishment time of a steady state in the amplifier would necessarily be long (1 µs). However, it is clear that by considerably reducing the size of the loop, it is possible to rise to repetition rates of about 100 Mbit/s without any major problem.

In the preceding description particular attention has been paid to air wedges for producing the optical filter. However, it is clear that the invention is not limited thereto and any other optical filter can be suitable (line filter, etc.).

We claim:

1. A process for the transposition of an optical modulation on an adjustable wavelength, comprising the steps of:

relooping an output of a semiconductor amplifier laser to an input by a feedback loop provided with an optical filter tuned to a first wavelength so that said semiconductor amplifier laser self-oscillates at said first wavelength;

amplitude modulating an incident beam so that the amplitude of the incident beam alternates between a high level and a low level;

injecting the incident beam into the semiconductor amplifier laser;

wherein when the amplitude of the incident beam is at the low level of the amplitude, said semiconductor amplifier laser self-oscillates at said first wavelength and when the amplitude of the incident beam is at a high level, the semiconductor amplifier laser no longer self-oscillates at the first wavelength but instead performs a simple amplification of the incident beam at the second wavelength;

whereby the amplitude and modulation of the incident beam at said second wavelength is thus transposed into a complementary amplitude modulation at the first wavelength.

2. The process according to claim 1, wherein the semiconductor amplifier laser selectively self-oscillates on a plurality of modes of different wavelength, one of said plurality of wavelengths being selected by tuning the filter in the feedback loop to said first wavelength while the incident beam is set to said second wavelength, so that the transposition takes place from one mode to another.

3. The process according to claim 1, wherein said optical filter is an air wedge.

* * * * *

UNITED STATES PATENT AND TRADEMARK OFFICE
CERTIFICATE OF CORRECTION

PATENT NO.       : 5,539,760
APPLICATION NO.  : 08/299663
DATED            : July 23, 1996
INVENTOR(S)      : Hervet Dupont et al.

Page 1 of 1

It is certified that error appears in the above-identified patent and that said Letters Patent is hereby corrected as shown below:

<u>Title Page</u>

Item 56, under OTHER PUBLICATIONS add:  IEEE Transactions Photonics Technology Letters, vol. 3, no. 12, December 1991, pages 1054-1057, M. Schilling, et al., "Multifunctional Photonic Switching Operation of 1500 nm Y-Coupled Cavity Laser (YCCL) with 28 nm Tuning Capability."

Electronics Letters, November 7, 1991, vol. 27, no. 23, pages 2183-2185, P. Pottier, et al., "1.5 Gbit/s Transmission System Using All Optical Wavelength Convertor Based on Tunable Two-Electrode DFB Laser."

Electronics Letters, vol. 25, no. 20, September 28, 1989, pages 1360-1362, K. Inoue, et al., "Wavelength Conversion for FM Light Using Light Injection Induced Frequency Shift in DFR-LD."

Electronics Letters, August 18, 1988, vol. 24, no. 17, pages 1106-1107, G. Grosskopf, et al., "140 Mbit/s DPSK Transmission Using an All-Optical Frequency Convertor with a 4000 GHz Conversion Range."

IEEE Photonics Technology Letters, vol. 4, no. 10, October 1992, pages 1168-1171, J.M. Wiesenfeld, et al., "Cascadability and Fanout of Semiconductor Optical Amplifier Wavelength Shifter."

Signed and Sealed this
Eighth Day of February, 2011

David J. Kappos
*Director of the United States Patent and Trademark Office*